(12) United States Patent
Lin et al.

(10) Patent No.: US 11,177,433 B2
(45) Date of Patent: Nov. 16, 2021

(54) SPIN-TRANSFER TORQUE DEVICE

(71) Applicant: IMEC vzw, Leuven (BE)

(72) Inventors: Tsann Lin, Leuven (BE); Johan Swerts, Kessel-Lo (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/206,855

(22) Filed: Nov. 30, 2018

(65) Prior Publication Data

US 2019/0189915 A1 Jun. 20, 2019

(30) Foreign Application Priority Data

Dec. 19, 2017 (EP) ..................................... 17208565

(51) Int. Cl.
| | | |
|---|---|---|
| *H01L 43/08* | (2006.01) | |
| *H01L 43/10* | (2006.01) | |
| *H01L 43/12* | (2006.01) | |
| *H01L 43/02* | (2006.01) | |
| *H03K 19/23* | (2006.01) | |
| *H03K 19/18* | (2006.01) | |

(52) U.S. Cl.
CPC .............. *H01L 43/12* (2013.01); *H01L 43/02* (2013.01); *H01L 43/08* (2013.01); *H01L 43/10* (2013.01); *H03K 19/18* (2013.01); *H03K 19/23* (2013.01)

(58) Field of Classification Search
None
See application file for complete search history.

(56) References Cited

U.S. PATENT DOCUMENTS

| | | | |
|---|---|---|---|
| 9,741,372 B1 * | 8/2017 | Campiglio | G11B 5/3903 |
| 2010/0321993 A1 | 12/2010 | Nikonov et al. | |
| 2011/0147816 A1 * | 6/2011 | Nikonov | B82Y 25/00 |
| | | | 257/295 |
| 2016/0049185 A1 | 2/2016 | Lu et al. | |
| 2016/0142012 A1 | 5/2016 | Wang et al. | |
| 2016/0163961 A1 * | 6/2016 | Li | H01L 43/02 |
| | | | 257/421 |
| 2017/0179373 A1 * | 6/2017 | Swerts | H01L 43/10 |
| 2017/0302280 A1 * | 10/2017 | Vaysset | H01L 43/08 |

OTHER PUBLICATIONS

Testa, E. et at., "Inverter Propagation and Fan-out Constraints for Beyond-CMOS Majority-based Technologies," IEEE Computer Society Annual Symposium on VLSI, pp. 164-169, 2017.
Extended European Search Report received in European Application No. 17208565.6 dated Jun. 28, 2018 in 9 pages.

* cited by examiner

*Primary Examiner* — Xiaoming Liu
(74) *Attorney, Agent, or Firm* — Knobbe, Martens, Olson & Bear, LLP

(57) ABSTRACT

The disclosed technology generally relates semiconductor devices, and relates more particularly to a spin transfer torque device, a method of operating the spin-transfer torque device and a method of fabricating the spin-transfer torque device. According to one aspect, a spin-transfer torque device includes a magnetic flux guide layer and a set of magnetic tunnel junction (MTJ) pillars arranged above the magnetic flux guide layer. Each one of the pillars includes a separate free layer, a separate tunnel barrier layer and a separate reference layer. A coupling layer is arranged between the magnetic flux guide layer and the MTJ pillars, wherein a magnetization of the separate free layer of each of the each of the MTJ pillars is coupled, parallel or antiparallel, to a magnetization of the magnetic flux guide layer through the coupling layer.

16 Claims, 5 Drawing Sheets

SPIN-TRANSFER TORQUE DEVICE

CROSS-REFERENCE TO RELATED APPLICATIONS

This application claims foreign priority to European Patent Application No. 17208565.6, filed on Dec. 19, 2017, the content of which is incorporated by reference herein in its entirety.

BACKGROUND

Field

The disclosed technology generally relates semiconductor devices, and more particularly relates to a spin transfer torque device, a method of operating a spin-transfer torque device and a method for forming a spin-transfer torque device.

Description of the Related Technology

The physical scaling trend of semiconductor devices, such as logic and memory devices, faces various technological challenges, including fundamental limits of physical scaling. Alternative devices that can extend the physical scaling trend and/or provide novel computing or storage solutions include magnetic devices. Some magnetic devices include a magnetic tunnel junction (MTJ) structure, which can be included as part of logic and/or memory devices. A MTJ can be switched between a plurality of states of resistance by passing current, e.g. spin polarized current, therethrough. A MTJ structure may include a free layer, a tunnel barrier layer, a reference layer and a pinning layer. A magnetization state of the reference layer is fixed or pinned by the pinning layer. A magnetization state of the free layer may be switched between two different directions, e.g., parallel and antiparallel directions relative to the magnetization direction of the reference layer, by passing a current through the MTJ structure. For example, the reference layer may spin-polarize the current passing therethrough, and the spin-polarized current passing through the free layer may cause the magnetization state of the free layer to change from one resistance state to another resistance state through a mechanism referred to as spin-transfer torque (STT).

FIG. 6 schematically illustrates an exemplary spin-transfer torque device referred to as a spin-transfer majority gate (STMG) device 600. The STMG device 600 includes four magnetic tunnel junction pillars (MTJ) 610, 620, 630, 640, each including a reference layer 612, a pinning layer 614 and a top electrode 616. The four MTJ pillars 610, 620, 630, 640 are as shown arranged on a bottom electrode layer 602, a free layer 604 and a tunnel barrier layer 606, each of which are shared by the four pillars 610, 620, 630, 640. Three pillars 610, 620, 630 are arranged as input pillars and the pillar 640 is arranged as an output pillar. As the free layer 604 is commonly connected to the four pillars 610, 620, 630, 640, the magnetization direction of the free layer portion 604d under the output pillar 640 can be influenced by the magnetization of the free layer portions 604a, 604b, 604c under the input pillars 610, 620, 630. More specifically, the magnetization of the free layer portion 604d under the output pillar 640 can assume the magnetization direction of the majority of the free layer portions 604a-604c. A majority gate operation is hence realized.

SUMMARY OF CERTAIN INVENTIVE ASPECTS

The inventors have realized that some designs according to prior art spin-transfer torque devices, including some prior art STMG devices, may be challenging to manufacture, such as in full wafer scale high volume production. Fabrication of a spin-transfer torque device typically involves etching through the pinning layer and the reference layer, to form separate pillars with separate pinning and reference layers, while stopping on the tunnel barrier layer. Stopping on the tunnel barrier layer (which may have a thickness on the order of few to tens of angstroms) can be, however, challenging, in particular when etching to form a plurality of pillars in parallel. For example, because the etch rate and/or the thicknesses of one or more layers may vary wafer-to-wafer, within-wafer, within-die, or even within device, the etch process may stop on some portions of the tunnel barrier layer, while under-etching or over-etching on other portions. When the stack is over-etched the etching process may damage the tunnel barrier layer as well as the underlying free layer. When the stack is under-etched, adjacent pillars may be electrically shorted. Over-etching or under-etching may cause loss of magnetic anisotropy of the free layer, among other device degradations or failures. As a consequence, magnetic and electrical performance may vary across the wafer, resulting in an overall reduced device performance.

An objective of the disclosed technology is to provide a spin transfer torque device, as well as a method for forming such a device, which enables the aforementioned issues to be mitigated. Further and alternative objectives may be understood from the following.

According to a first aspect of the disclosed technology, a spin-transfer torque device comprises a magnetic flux guide layer, a set of magnetic tunnel junction pillars arranged above the magnetic flux guide layer, wherein each one of the pillars includes a separate free layer, a separate tunnel barrier layer and a separate reference layer. The spin-transfer torque device additionally comprises a coupling layer arranged between the magnetic flux guide layer and the magnetic tunnel junction pillars, wherein a magnetization of each one of the separate free layers is coupled, parallel or antiparallel, to a magnetization of the magnetic flux guide layer through the coupling layer.

The disclosed spin-transfer torque device accordingly includes a coupling layer and a magnetic flux guide layer for coupling of the magnetizations of each one of the separate free layers of the set of magnetic tunnel junction pillars. The magnetic interaction between the free layers of the magnetic tunnel junction pillars is hence provided by means of the coupling layer and the magnetic flux guide layer guiding a magnetic flux between the free layers.

Advantageously, since each magnetic tunnel junction pillar includes a respective separate free layer, a respective separate tunnel barrier layer and a respective separate reference layer, potential adverse impact on the device performance during fabrication, e.g., by unintentional (over-) etching into a common tunnel barrier layer and a common free layer, may be reduced. In addition, the presence of the coupling layer may serve to protect the magnetic flux guide layer from the etching process. This allows the spin-transfer torque device to be manufactured at a full wafer scale with magnetic tunnel junction pillars having improved uniformity. Consequently, the coupling layer serves at least to protect the magnetic flux guide layer during device fabrication and to enhance or enable the interaction between the free layers of different magnetic tunnel junction pillars.

As used herein, the terminology magnetic tunnel junction (MTJ) may refer to a tunnel junction formed by a stack including a reference layer, a tunnel barrier layer and a free layer, which can provides a magnetic tunnel function. Meanwhile, the terminology MTJ pillar may be used to refer to a structure including (among others) a MTJ, e.g., a patterned stack including an MTJ.

As used herein, a pillar refers to a structure extending in a direction e.g., a vertical direction or a normal direction with respect to a major surface of a substrate.

As used herein, the term vertical (for instance with reference to a direction or a plane) denotes a geometrical axis being parallel to a stacking direction of the layers of the device. Correspondingly, a vertical axis is perpendicular to a main plane of extension or a main surface of any of the layers of the device, such as the magnetic flux guide layer. Terms such as above and under as used herein may accordingly refer to opposite directions along the vertical axis, with respect to a reference. As used herein, the term horizontal denotes a horizontal axis being perpendicular to the vertical axis.

The device may include a substrate supporting the aforementioned layers of the device. In this case, a vertical direction/plane may be understood as a direction/plane being perpendicular to a main plane of extension or main surface of the substrate. Correspondingly, a horizontal direction/plane may be understood as a direction parallel to a main plane of extension or a main surface of the substrate.

The magnetic flux guide layer (which for brevity may be referred to as the flux guide layer) may, as it is arranged below the magnetic tunnel junction pillars, include a set of portions, each portion being arranged under a respective one of the set of MTJ pillars. The flux guide layer may extend uninterrupted in a horizontal direction between the respective portions to physically connect the respective portions of the flux guide layer. Thus, while the portions of the flux guide layer may be laterally adjacent to each other and overlap the respective MTJ pillars formed thereover, the portions may be included as part of a continuous physical layer. As described herein, a parallel coupling of a magnetization of a free layer to a magnetization of the magnetic flux guide layer through the coupling layer describes a configuration in which the magnetization of the free layer is coupled parallel to the magnetization of the portion of the magnetic flux guide layer under the free layer with such a coupling strength that the magnetizations of the free layer and the magnetic flux guide layer portion are parallel with respect to each other.

As described herein, by an antiparallel coupling of a magnetization of a free layer to a magnetization of the magnetic flux guide layer through the coupling layer describes a configuration in which the magnetization of the free layer is coupled antiparallel to the magnetization of the magnetic flux guide layer portion under the free layer with such a strength that the magnetizations of the free layer and the magnetic flux guide layer portion are antiparallel with respect to each other.

The magnetic flux guide layer may include a ferromagnetic layer. The ferromagnetic layer may comprise cobalt (Co), or be a Co-including layer. The Co-including layer may include or consist of Co. In some embodiments, the magnetic flux guide layer may comprise a plurality of layers or sublayers. For example, the magnetic flux guide layer may include a first ferromagnetic layer, a texture breaking layer arranged on the first ferromagnetic layer and a second ferromagnetic layer arranged on the texture breaking layer. The first ferromagnetic layer may comprise CoFeB or be a CoFeB-including layer or a CoFeB layer. The texture breaking layer may comprise Ta or be a Ta-including layer or a Ta layer. The second ferromagnetic layer may comprise Co or be a Co-including layer or a Co layer. This enables forming of a CoFeB-based flux guide layer with a perpendicular magnetic anisotropy (PMA).

The device may further include a seed layer wherein the magnetic flux guide layer is arranged on the seed layer. A seed layer may facilitate forming of the flux guide layer with the proper crystal structure and magnetic anisotropy. In particular, a seed may provide a suitable texture for flux guide layer irrespective of the texture of below layers, such as a bottom electrode layer. It may also contribute to a perpendicular magnetic anisotropy (PMA) of the magnetic flux guide layer via interfacial anisotropy between the seed and the flux guide. The seed layer may comprise MgO or be an MgO-layer. This enables forming of the aforementioned CoFeB-based flux guide layer with PMA.

The coupling layer of the spin-transfer torque device may be a nonmagnetic layer, adapted to provide a parallel or an antiparallel coupling of magnetizations.

The coupling layer may, as it is arranged below the magnetic tunnel junction pillars, includes a set of portions, each portion being arranged under a respective one of the set of MTJ pillars. Each portion of the coupling layer at least partially overlaps with the MTJ pillar formed thereover. The coupling layer may extend uninterrupted between the respective portions to physically connect the respective portions of the coupling layer.

Accordingly, the separate free layer of a first MTJ pillar of the set of MTJ pillars may be coupled to the flux guide layer portion arranged underneath the first MTJ pillar, via the coupling layer portion arranged underneath the first MTJ pillar. The separate free layer of a second MTJ pillar of the set of MTJ pillars may be coupled to the flux guide layer portion arranged underneath the second MTJ pillar, via the coupling layer portion arranged underneath the second MTJ pillar. This may apply correspondingly to any further MTJ pillars of the set of MTJ pillars (e.g. a third MTJ pillar, a fourth MTJ pillar, etc.)

The coupling layer may comprise a transition metal or be a transition metal-including layer providing an RKKY-coupling oscillating between parallel and antiparallel as a function of layer thickness, wherein the thickness of the transition metal layer is such that the RKKY-coupling is either parallel or antiparallel. A transition metal-including layer providing an oscillating RKKY-coupling ("RKKY metal") makes it possible to provide a coupling function and etch barrier function by appropriately selecting the thickness thereof. The RKKY coupling is also known as the Ruderman-Kittel-Kasuya-Yosida interaction. A coupling layer of a RKKY-metals may provide a favorable etch stopping power to typical dry etching processes.

The coupling layer may comprise one or more of Ru, Ir, Os, or Rh. These materials allow formation of a coupling layer that provides, among other things, a sufficiently strong coupling, a texture compatible with materials typically used in state of the art MTJs, and a favorable etch stopping power or etch selectivity during MTJ pillar dry etching, for instance by ion beam etching (IBE) or reactive ion etching (RIE).

The coupling layer may be a layer including or consisting of Ru and having a thickness in the range of 13 Å±2 Å. Thereby, the coupling layer may be of a sufficient thickness to serve as an etch stop and also to provide a parallel coupling between the separate free layers and the magnetic flux guide layer, with a coupling strength sufficient to allow the respective magnetic flux guide layer portions to exhibit a magnetization that is the same or parallel to that of the respective separate free layers. Alternatively, the coupling layer may be a layer including or consisting of Ru and having a thickness in the range of or 18 Å±2 Å. Thereby, the coupling layer may be of a sufficient thickness to serve as an etch stop and also to provide an antiparallel coupling between the separate free layers and the magnetic flux guide layer, with a strength sufficient to allow the respective magnetic flux guide layer portions to exhibit a magnetization that is opposite or antiparallel to that of the respective separate free layers.

The coupling layer may be a layer including or consisting of Ir and having a thickness in the range of 14 Å±1 Å or in the range of 17 Å±2 Å, or in the range of 20 Å±2 Å. Thereby, the coupling layer may be of a sufficient thickness to serve as an etch stop and to provide a parallel or antiparallel coupling, respectively.

The coupling layer may be a layer including or consisting of Rh and having a thickness in the range of 18 Å±2 Å or in the range of 15 Å±1 Å. Thereby, the coupling layer may be of a sufficient thickness to serve as an etch stop and to provide an antiparallel or parallel coupling, respectively.

Each MTJ pillar of the set of MTJ pillars includes a separate free layer. Accordingly, the free layer of each MTJ pillar is physically disconnected from the free layers of the other MTJ pillars of the set of MTJ pillars.

Each free layer may include a ferromagnetic layer. Each free layer may be a layer having a (net) magnetization which may be varied such that the direction of the magnetization or magnetic moments of the free layer may be varied. The direction of the magnetization of the free layer may be switched between two states, a "parallel" state wherein the magnetization direction of the free layer is parallel to the magnetization direction of the reference layer and an "antiparallel" state wherein the magnetization direction of the free layer is antiparallel to the magnetization direction of the reference layer. The free layer may also be referred to as a storage layer. The magnetization of the free layer may be oriented in-plane (in-plane magnetic anisotropy) or out of plane (perpendicular magnetic anisotropy, PMA).

The coupling layer may be arranged directly on the flux guide layer and the free layers of the MTJ pillars may be arranged directly on the coupling layer. Thereby a magnetic coupling strength may be determined mainly by the materials selection of the coupling layer and its thickness without any intermediate layers reducing the coupling strength.

Each MTJ pillar of the set of MTJ pillars includes a separate tunnel barrier layer. Accordingly, the tunnel barrier layer of each MTJ pillar may be physically disconnected from the tunnel barrier layers of the other MTJ pillars of the set of MTJ pillars.

Each tunnel barrier layer may be a layer arranged between the reference layer and the free layer. The tunnel barrier layer may be adapted to allow a tunneling current across the tunnel barrier layer. The tunnel barrier layer may be a non-magnetic and electrically insulating layer.

Each MTJ pillar of the set of MTJ pillars includes a separate reference layer. Accordingly, the reference layer of each MTJ pillar may be physically disconnected from the reference layers of the other MTJ pillars of the set of MTJ pillars.

Each reference layer may be a layer having a magnetization which is fixed or pinned. That is, the direction of the magnetization or magnetic moments of the reference layer is fixed or pinned. The reference layer may also be referred to as the fixed layer or the pinned layer. The magnetization of the reference layer may be oriented in-plane (in-plane magnetic anisotropy) or out of plane (PMA).

Each reference layer may include a ferromagnetic layer. Each reference layer may be a single material layer, or a composite layer formed by a number of sub-layers, where at least one of the sub-layers is ferromagnetic.

A relative orientation of the magnetization directions of the reference layer and the free layer of an MTJ pillar influences an electric resistance of the MTJ pillar. The MTJ pillar may exhibit a relatively low resistance when the magnetization of the reference layer and the free layer are aligned or parallel and a relatively high resistance when the magnetization directions of the reference layer and the free layer are antiparallel with respect to each other. The tunnel magnetoresistance ratio (TMR) is a measure of the difference in the MTJ electrical resistance between the antiparallel state and the parallel state.

Each MTJ pillar of the set of MTJ pillars may further include a separate pinning layer. The pinning layer may be arranged above the reference layer. Each pinning layer may be adapted to fix or pin the magnetization direction of the reference layer underneath. By the pinning effect exerted on the reference layer by the pinning layer, the reversal field of the reference layer may be increased compared to the reversal field of the free layer.

Each pinning layer may include a hard ferromagnetic layer. Each pinning layer may also be configured as a synthetic antiferromagnetic layer.

The spin-transfer torque device may further comprise a bottom electrode layer arranged under the flux guide layer. The bottom electrode layer may be electrically connected to each one of the magnetic tunnel junction pillars through the flux guide layer and the coupling layer. By providing a common bottom electrode layer, the need for plural electrical interconnections to the bottom part of the device may be avoided.

The spin-transfer torque device may further comprise a separate top electrode arranged on a respective one of the magnetic tunnel junction pillars. Currents (e.g. for reading or writing) may accordingly be selectively applied to each one of the MTJ pillars of the set.

In combination with a common bottom electrode layer, a respective conductive path may be formed between the bottom electrode layer and each one of the top electrodes of the MTJ pillars.

According to one embodiment, the set of MTJ pillars includes at least one magnetic tunnel junction pillar configured as an input pillar and at least one magnetic tunnel junction pillars configured as an output pillar, wherein a magnetization state of the separate free layer of each of the at least one input pillar is configured to influence a magnetization state of the separate free layer of each of the at least one output pillar via the coupling layer and the magnetic flux guide layer. The device may hence be configured as a spin-based logic device wherein a magnetization state of the free layer of the output pillar is dependent on the magnetization states of the free layers of the input pillars.

The spin-transfer torque device may be configured as a majority gate device including three input pillars and one output pillar.

According to a second aspect of the disclosed technology, a method of operating a spin-transfer torque device comprises: applying a write current to a number of the input pillars to set a magnetization state of the separate free layer of each of the input pillars (e.g., to an antiparallel state or a parallel state), thereby influencing a magnetization state of the separate free layer of the output pillar, and determining a magnetization state of the separate free layer of the output pillar.

Since the respective magnetization of the separate free layers of the input pillars are coupled to the magnetization of the free layer of the output pillar via the coupling layer and the magnetic flux guide layer, a magnetization state of the free layer of the output pillar is dependent on the magnetization states of the free layers of the input pillars and may hence be set to either an antiparallel state or a parallel state. By applying a write current to a number of the input pillars and determining a resulting magnetization state of the separate free layer of the output pillar, an input-output characteristic of the device may be determined.

In case the spin-transfer torque device is configured as a majority gate device, the free layer of the output pillar will assume a magnetization state corresponding to that of a majority of the free layers of the input pillars.

According to a third aspect of the disclosed technology, a method of fabricating a spin-transfer torque device comprises forming a layer stack including a magnetic flux guide layer, a coupling layer, a free layer, a tunnel barrier layer and a reference layer. The method additionally comprises forming, by etching the layer stack, a plurality of separate magnetic tunnel junction pillars above the coupling layer. Each magnetic tunnel junction pillar includes a separate a free layer, a separate tunnel barrier layer and a separate reference layer. The separate free layer of each one of the plurality of magnetic tunnel junction pillars is coupled, parallel or antiparallel, to the magnetic flux guide layer, through the coupling layer.

During the etching of the layer stack, the coupling layer may cover and thus counteract etching of the flux guide layer. A spin-transfer torque device having the advantages described in the above may accordingly be manufactured.

The etching of the layer stack may be stopped at or on the coupling layer. Accordingly, a number of discrete magnetic tunnel junction pillars may be formed, each extending vertically from the coupling layer.

The method may further comprise forming a bottom electrode layer and subsequently forming the layer stack above the bottom electrode layer.

Forming the layer stack may further include forming a top electrode layer, wherein the top electrode layer is formed into separate top electrodes on the plurality of separate magnetic tunnel junction pillars during the etching. Top electrodes may hence be formed in a self-aligned manner with respect to the separate magnetic tunnel junction pillars.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

Figure 1:
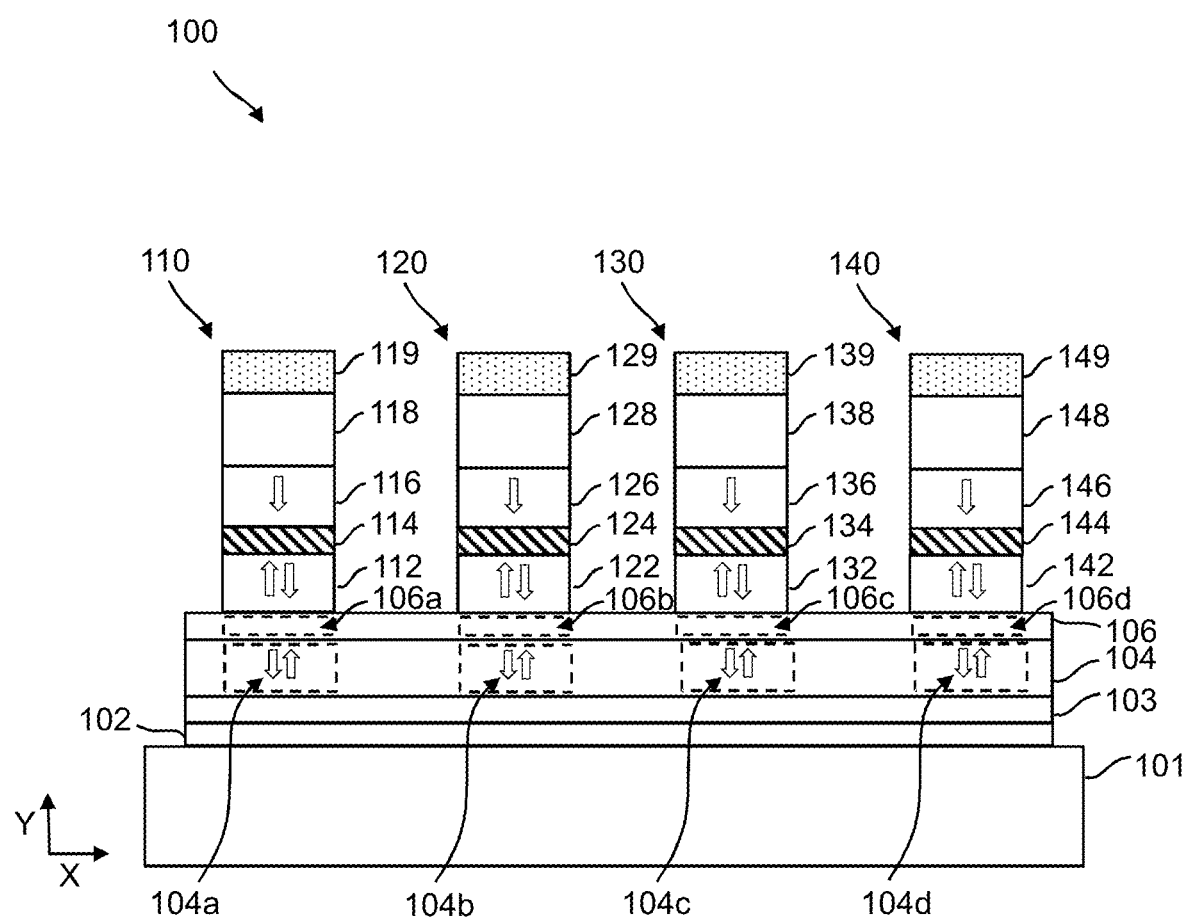
FIG. 1 is a schematic side-view of a spin-transfer torque device.
Figure 2:
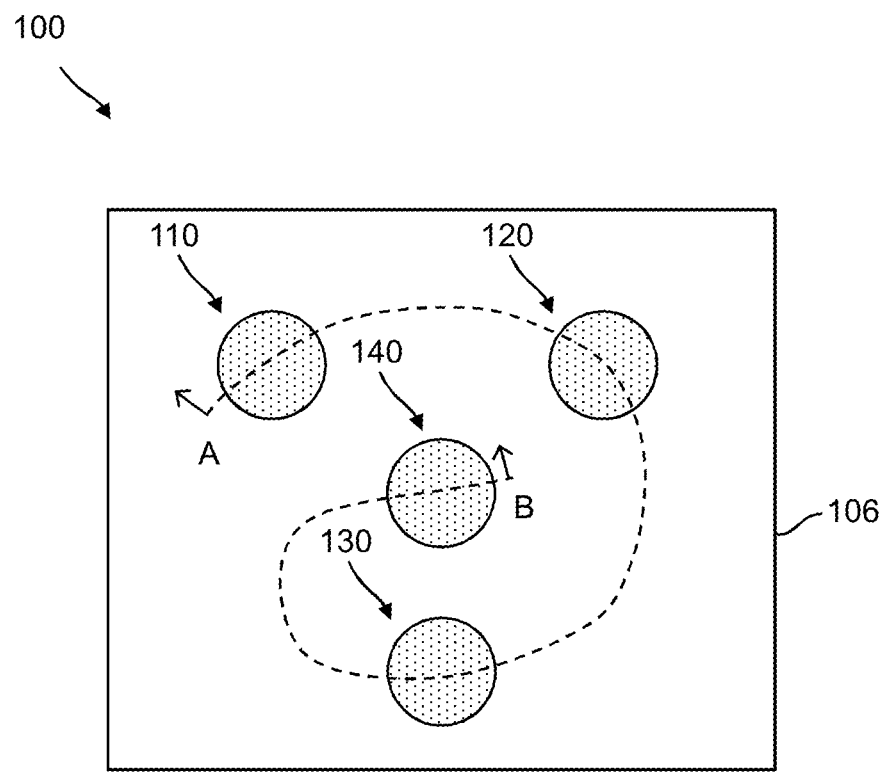
FIG. 2 is a schematic top-view of a spin-transfer torque device.

FIG. 1 schematically illustrates cross-sectional side-view of a spin-transfer torque device 100 according to embodiments. FIG. 2 schematically illustrates a top-down view of the device 100. To facilitate understanding of the structure of the device 100, the cross-section in FIG. 1 is taken along the curve AB indicated in FIG. 2. As shown, the device 100 includes a plurality of layers, stacked along a vertical direction denoted Y. A main plane of extension of each layer is parallel to a horizontal plane denoted X. It should be noted that for the purpose of illustrational clarity, the various layers and other features of the stacks may not be drawn to scale, and their relative dimensions, in particular their thicknesses, may differ from an actually fabricated physical stack.

The spin-transfer torque device 100 comprises a magnetic flux guide layer 104. The device 100 comprises a coupling layer 106 arranged on the flux guide layer 104. The device 100 comprises a set of magnetic tunnel junction (MTJ) pillars 110, 120, 130, 140. The MTJ pillars 110, 120, 130, 140 are arranged on the coupling layer 106. Each one of the MTJ pillars 110, 120, 130, 140 includes a separate free layer 112, 122, 132, 142, a separate tunnel barrier layer 114, 124, 134, 144 and a separate reference layer 116, 126, 136, 146. As will be described further below, a magnetization of each one of the separate free layers 112, 122, 132, 142 is coupled to a magnetization of the flux guide layer 104, through the coupling layer 106.

The illustrated device 100 includes four MTJ pillars 110, 120, 130, 140 and is configured as a majority gate device wherein three of the MTJ pillars, e.g., the MTJ pillars 110, 120, 130, are configured as input pillars and the remaining MTJ pillar, e.g., the MTJ pillar 140, is configured as an output pillar. The device 100 may include further majority gate devices formed by further similarly configured sets of three or more input MTJ pillars and one output MTJ pillar. As shown in FIG. 2, the input pillars 110-130 are circumferentially distributed about the output pillar 140. Other arrangements are also possible such as a cross-configuration etc.

The spin-transfer torque device 100 includes a substrate 101. The substrate 101 may be any conventional substrate or wafer, such as a semiconductor substrate. Examples of semiconductor substrates include a Si substrate, a Ge substrate, a SiGe substrate, a SiC substrate, a SOI substrate, a GeOI substrate, a SiGeOI substrate to name a few.

Although not shown in FIG. 1, the substrate 102 may support an active device portion or front-end-of-line (FEOL) portion including active devices. The active devices may be formed in a semiconductor portion of the substrate 101. The devices may include logic circuit devices. The devices may include switches used for conducting read and write currents for the device 100, as will be described in more detail below. Example active devices include MOSFETs, MISFETs, BJTs, JBTs, FinFETs, nanowire FETs to name a few.

The substrate 101 may further support a not-shown interconnect structure or back-end-of-line (BEOL) portion. The BEOL portion may be arranged above the FEOL portion. The BEOL-portion may interlayer dielectrics embedding the MTJ pillars 110, 120, 130, 140 and a number of metal layers The metal layers may be formed by horizontally extending conductive paths. Metal layers may, for instance, be formed of or comprise Cu, W, Au, Ag, Al, Co, Ru, or a combination thereof, among other metals. The interlayer dielectrics may, for instance, include silicon oxide, silicon oxide nitride, silicon carbide nitride, silicon nitride or a combination thereof, among other dielectrics. The BEOL-portion may further include conductive vertical vias interconnecting metal layers through the interlayer dielectrics. Vias may for instance be formed of or include Cu, W, Au, Ag, Al, Co, Ni, Ru, highly doped semiconductor materials or a combination thereof, among other materials. One or more of the metal layers may define bit lines, word lines, select lines or the like for the MTJs. The conductive paths of the BEOL-portion may together with the active devices of the FEOL-portion define logic circuitry for controlling reading and writing operations and for driving bit lines, word lines etc.

The device 100 comprises a bottom electrode layer 102. The bottom electrode layer 102 is arranged under the flux guide layer 104. The bottom electrode layer 102 may be formed of Ta, Ti, TaN, TiN, or combination thereof, among others. The bottom electrode layer 102 may also be formed of an alloy, or as a composite layer of sub25 layers, of two or more of the materials. The bottom electrode layer 102 may be arranged on and in contact with a conductive line or a via of the BEOL portion. The conductive line or via may in turn be connected to a source/drain electrode of a transistor, such as an access transistor.

According to a variation, the bottom electrode layer 102 need not be common to the MTJ pillars 110-140 but a discrete bottom electrode may be formed under each one of the MTJ pillars 110-140. Each discrete bottom electrode may accordingly be connected to a separate access transistor. Thereby the MTJ pillars 110-140 may be individually addressed.

The device 100 comprises a seed layer 103. The seed layer 103 is arranged on the bottom electrode layer 102. The seed layer 103 may be adapted to provide a suitable texture for the flux guide layer 104. The seed layer 104 be a single layer, for instance of a metal such as Ta, Ru, Mo, W, Hf, Ni, Cr, Pt, Pd, PtMn, IrMn, or alloys or a combination thereof. The seed layer 104 may also include an oxide layer, such as MgO, MgTiO, MgAlO or a combination thereof. The seed layer 103 may also be a composite layer formed by a number of sub-layers. The seed layer 103 may, for instance, be a composite layer of a Ta-layer, a CoFeB-layer and an MgO-layer. The thickness of the seed layer 103 or the sub-layers thereof may be on the order of a few to some tens of Angstroms (Å)

The flux guide layer 104 is arranged on the seed layer 103. Depending on the choice of materials for the bottom electrode layer 102 and the flux guide layer 104 it may however be possible to omit the seed layer 103 wherein the flux guide layer 104 may be arranged directly on the bottom electrode layer 102. The flux guide layer 104 maybe a single layer of a ferromagnetic material comprising, for instance of Co, CoFe, CoFeB, Fe, FeB, CoB or a combination or an alloy thereof. The flux guide layer 104 may also be a composite layer formed by a number of sub-layers, at least one of the sub-layers being ferromagnetic. The flux guide layer 104 may for instance be a composite layer of a first ferromagnetic CoFeB-layer, a Ta-layer and a second ferromagnetic Co-including layer. The second ferromagnetic layer may be a Co-layer, a CoFe-layer or a laminate of Co/Pt, Co/Pd or Co/Ni. The thickness of the flux guide layer 104 or the sublayers thereof may be on the order of a few to some tens of Å.

The coupling layer 106 of the device 100 is arranged on the flux guide layer 104. The coupling layer 106 may be laterally coextensive with the flux guide layer 104. The coupling layer 106 is adapted to a magnetic coupling between the magnetic moments of the separate free layers 112, 122, 132, 142 and the flux guide layer 104. The coupling layer 106 may be a single layer of a transition metal such as Ru, Ir or Rh. The coupling layer 106 may for instance be formed by a Ru-layer with a thickness of 13 Å±2 Å or 18 Å±2 Å. The coupling layer 106 may also be formed by a Ir-layer with a thickness of 14 Å±1 Å, 17 Å±2 Å, or 20 Å±2 Å. The coupling layer 106 may also be formed by a Rh-layer with a thickness of 15 Å±1 Å, or 18 Å±2 Å. The coupling layer 106 may also be a composite layer formed by a number of sublayers of for instance Ru, Ir, Rh, Os, or by a combination or an alloy of two or more of the materials or an alloy predominantly include one of the materials. More generally the coupling layer 106 may be formed by a non-magnetic material providing an either parallel or anti-parallel coupling, a texture compatible with materials typically used in state of the art MTJs and providing an etch stopping power during MTJ pillar etching. Non-magnetic materials include, in addition to non-ferromagnetic materials, materials presenting no or substantially no net magnetization in absence of an external magnetic field, such as para- and diamagnetic materials.

As described above, each MTJ pillar 110-140 includes respective separate free layer, tunnel barrier and reference layers. The MTJ pillar 110 includes in a bottom-up-direction a free layer 112, a tunnel barrier layer 114, a reference layer 116, a pinning layer 118 and a top electrode layer 119. The MTJ pillar 110 may include further (not shown) layers arranged between the shown layers. The MTJ pillar 110 may for instance, as per se is known in the art, include a texture breaking layer between the reference layer 116 and the pinning layer 118, and/or a capping layer between the pinning layer 118 and the top electrode layer 119.

The free layer 112 is arranged on the coupling layer 106. The free layer 112 may be a single layer of a ferromagnetic material, for instance of Fe, Co, FeB, CoB, CoFe, CoFeB or a combination or an alloy thereof. The free layer 120 may also be a composite layer formed by a number of sub-layers, at least one of the sublayers being ferromagnetic. The free layer 112 may, for instance, be or include a composite layer such as a Co/X/CoFeB tri-layer where X denotes for instance Ta, W or Mo, V, Hf, Cr, a combination or an alloy thereof, and CoFeX, CoFeBX, FeBX, CoBX with X=Ta, W, Mo, V, Cr, Hf, a combination or an alloy thereof. The thickness of the free layer 112 or the sub-layers thereof may be on the order of a few to some tens of Å.

The tunnel barrier layer 114 is arranged on the free layer 112. The tunnel barrier layer 114 may be an electrically insulating material, for instance a dielectric material such as MgO, AlOx, MgAlOx, MgTiOx or a combination or an alloy thereof. The barrier layer 114 may be a single layer. The thickness of the tunnel barrier layer 114 may be on the order of about one to a few Å. Although FIG. 1 shows a single tunnel barrier configuration, the MTJ pillar 110 also may include a dual-tunnel barrier layer configuration, such as a stack of a first free layer, a first tunnel barrier layer, a second free layer and a second tunnel barrier layer. This configuration may be extended beyond two tunnel barrier layer configurations.

The reference layer 116 is arranged on the tunnel barrier layer 116. The reference layer 116 may be a single layer of a ferromagnetic material, for instance of Fe, Co, FeB, CoB, CoFe, CoFeB, a combination or an alloy thereof. The reference layer 116 may also be a composite layer formed by a number of sub-layers, at least one of the sub-layers being ferromagnetic. The reference layer 116 may for instance be a composite layer such as a superlattice laminate including layers of two or more of Fe, Co, FeB, CoB, CoFe, CoFeB, or a combination or an alloy thereof.

The pinning layer 118 is arranged on the reference layer 116. The pinning layer 118 may include one or more hard magnetic layers. The pinning layer 118 may, for instance, include a superlattice laminate of a repetitive sequence of [Co/Pd], [Co/Pt] or [Co/Ni] bilayers. The pinning layer 118 may also include a Co-layer, a Fe-layer or a CoFe-layer or a superlattice laminate of a repetitive sequence of [Fe/X] or [CoFe/X], where X denotes Pd, Pt, Ni, Tb or Gd. The pinning layer 118 may also include an alloy composition, such as an alloy of Co, Fe or CoFe and Pt, Pd, Ni, Tb or Gd, or a ternary alloy of CoXCr, where X denotes Pt, Ni, Pd, Tb or Gd. The pinning layer 118 may be anti-ferromagnetically coupled to the reference layer 116 via a non-magnetic spacer layer (not shown), such as a thin Ru-layer. The pinning layer 118 may also be also be formed as a synthetic antiferromagnet (SAF) including two hard magnetic layers (e.g. each of a composition as set out above) and separated by a thin non-magnetic spacer layer, such as a Ru or Ir layer. A transition layer such a Ta, W, Mo, or alloy thereof or CoX, FeX CoFeX, where X is or includes Ta, W, Mo may be present between the reference layer and the pinning layer.

The top electrode layer 119 is arranged on the pinning layer 118. The top electrode layer 119 may be a single layer of for instance Ru or Ta. The top electrode layer 119 may also be a composite layer formed by a number of sub-layers, or an alloy, of Ru or Ta. The top electrode layer 119 may further be arranged in contact with a conductive line or a via of the BEOL-portion. The conductive line or via may in turn be connected to a source/drain electrode of a transistor, such as an access transistor.

The above description of the MTJ pillar 110 applies correspondingly to the further MTJ pillars 120, 130, 140, each including corresponding free layers 122, 132, 142, tunnel barrier layers 124, 134, 144, reference layers 126, 136, 146, pinning layers 128, 138, 149 and top electrode layers 129, 139, 149. A respective conductive path is formed between the bottom electrode layer 100 and each top electrode 119, 129, 139, 149.

As shown in FIG. 1, the flux guide layer 104 includes a portion 104a which is arranged under the MTJ pillar 110. The flux guide layer 104 further includes portions 104b, 104c and 104d arranged under the MTJ pillar 120, 130 and 140, respectively. The flux guide layer 104 extends between and joins the layer portions 104a-d to form a continuous layer. Correspondingly, the coupling layer 106 includes a coupling layer portion 106a which is arranged under the MTJ pillar 110. The coupling layer 106 further includes portions 106b, 106c and 106d arranged under the MTJ pillars 120, 130 and 140, respectively. The coupling layer 106 extends between and joins the layer portions 106a-d to form a continuous layer.

FIG. 1 includes arrows representing the direction of magnetization, i.e. the orientation of the magnetic moment, for the various magnetic layers of the device 100. Although FIG. 1 indicates magnetic layers having perpendicular magnetic anisotropy (PMA), it is as is known to the person skilled in the art also possible to form magnetic layers presenting an in-plane magnetic anisotropy.

As indicated by the oppositely directed arrows within the free layers 112, 122, 132, 142 the magnetization direction of the free layers may be independently switched between two opposite directions, a parallel direction (P) and an antiparallel direction (AP) with respect to the fixed magnetization direction of the respective reference layer 116, 126, 136, 146. An arrow indication of the magnetization of the pinning layers 118, 128, 138, 148 has been omitted since, as mentioned above, either SAF-or ferromagnetic configurations are possible. The illustrated downward orientation of the magnetization directions of the reference layers 116, 126, 136, 146 is merely an example and an upward orientation may also be established during fabrication.

As indicated by the reversed order of the oppositely directed arrows within the flux guide layer portions 104a-104d, the magnetization of the flux guide layer portions 104a-d is coupled antiparallel to the magnetization of the free layers 112, 122, 132, 142, respectively. More specifically, the flux guide layer portion 104a is coupled antiparallel, through the coupling layer portion 106a, to the free layer 112. Correspondingly, each one of the further flux guide layer portions 104b-104d is coupled antiparallel, through the respective intermediate coupling layer portion 106b-106d, to the respective free layer 122, 132, 142. Accordingly, in use of the device 100 the direction of the magnetization of each flux guide layer portion 104a-104d will be antiparallel to the direction of the magnetization of the free layer 112, 122, 132, 142 above. However, as discussed above, the coupling layer 106 may also be formed such that a parallel coupling between the respective free layers 112, 122, 132, 142 and the respective flux guide layer portions 104a-104d is provided.

Figure 3:
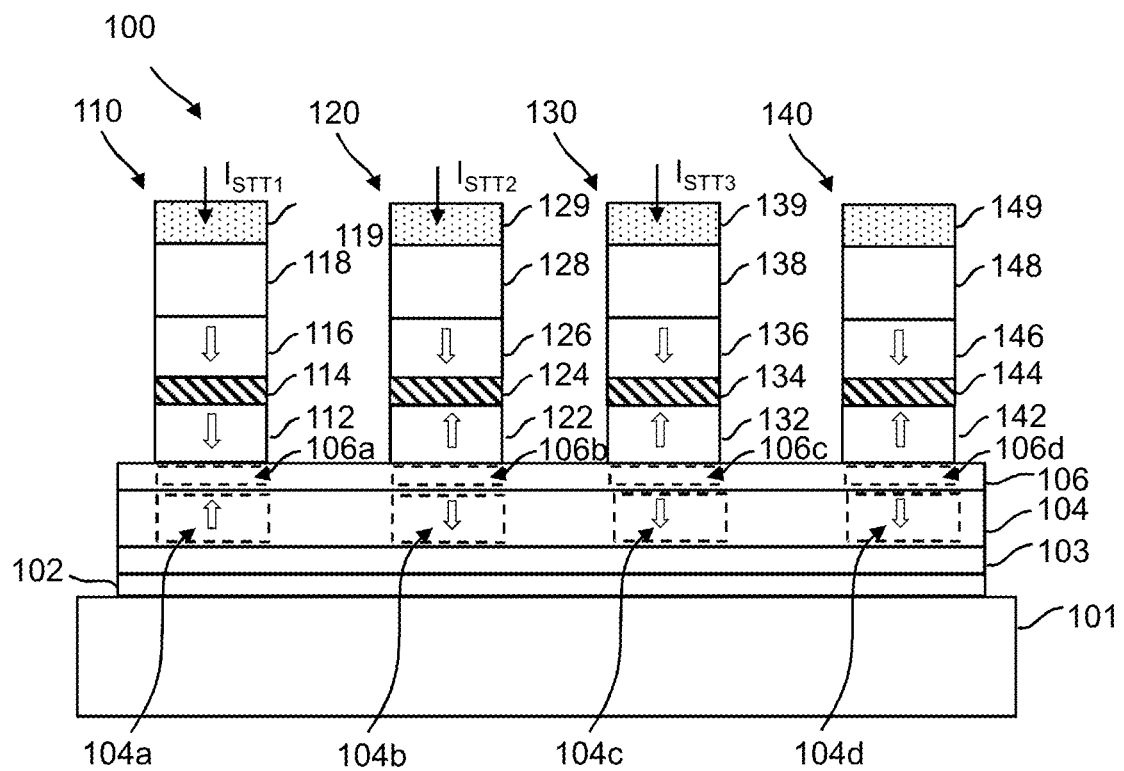
FIGS. 3 and 4 illustrate a spin-transfer torque device during operation.

FIG. 3 illustrates the device 100 during operation. Write currents $I_{STT1}$-$I_{STT3}$ are supplied to the respective input pillars 110-130 in order to set the free layer 112 to a P-state and each of the free layers 122 and 132 to an AP-state. The magnetization states of the free layers influence, through the antiparallel coupling through the coupling layer 106, the magnetization state of the respective flux guide layer portions 104a, 104b, 104c. The magnetization states of the flux guide layer portions 104a, 104b, 104c may in turn influence the magnetization states of the flux guide layer portion 104d such that the flux guide layer portion 104d assumes the magnetization state of the majority of the flux guide layer portions 104a-104c. In the illustrated example, the flux guide layer portion 104d assumes the same magnetization state as the flux guide layer portions 104b,104c. The magnetization state of the flux guide layer portions 104d in response influence, through the antiparallel coupling through the coupling layer 106, the magnetization state of the free layer 142.

Figure 4:
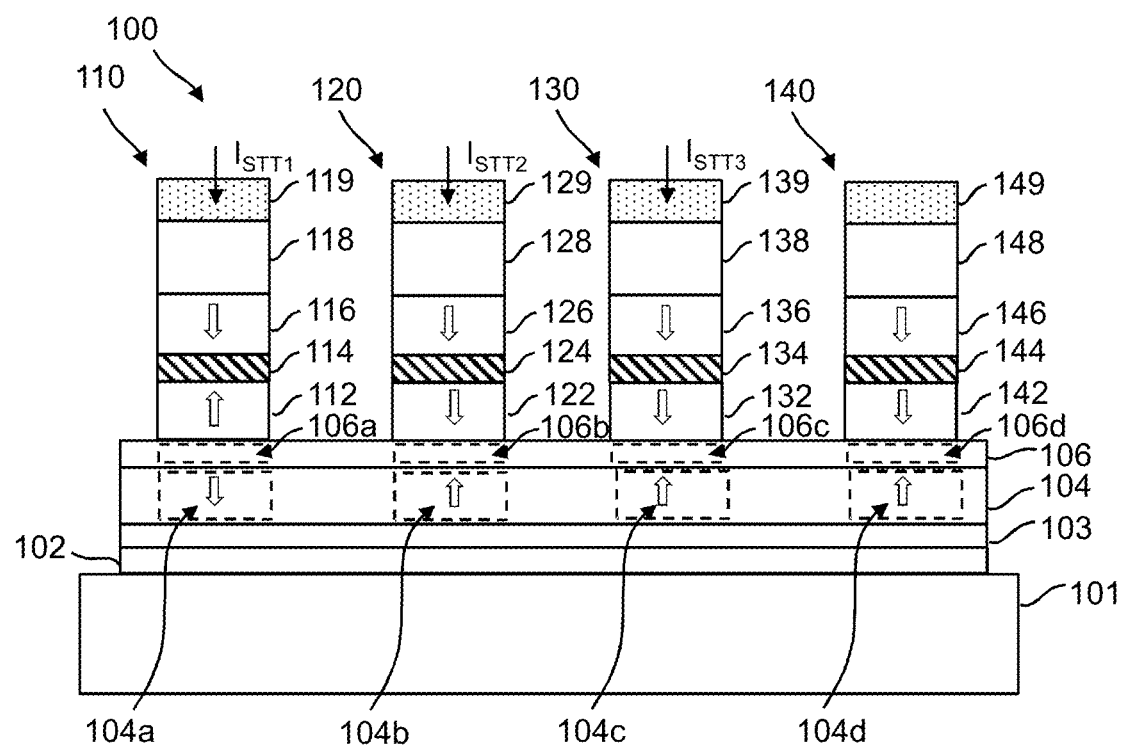

FIG. 4 illustrates a further operation example wherein write currents instead are supplied to the input pillars 110-130 in order to set the free layer 112 to an AP-state and each of the free layers 122 and 132 to a P-state. In response, the free layer 142 assumes a P-state.

The state of the free layer 142 may be determined in a same manner as read-out of MTJs of conventional STT-MRAMs. For instance the resistance of the output pillar 140 may be measured after applying a voltage across the output pillar 140. An AP-state (as in FIG. 3) may result in a greater resistance than a P-state (as in FIG. 4). The magnitude of the difference in resistance between a P-state and an AP-state depends on the TMR of the MTJ pillar. Associating, for instance, an input current for setting an input pillar 110, 120, 130 to an AP-state and a P-state with a logic "1" and a logic "0", respectively, and a P-state and an AP-state of the output pillar 140 with a logic "0" and a logic "1", respectively, it may be seen that the device 100 performs a function of a majority gate device.

Figure 5A:
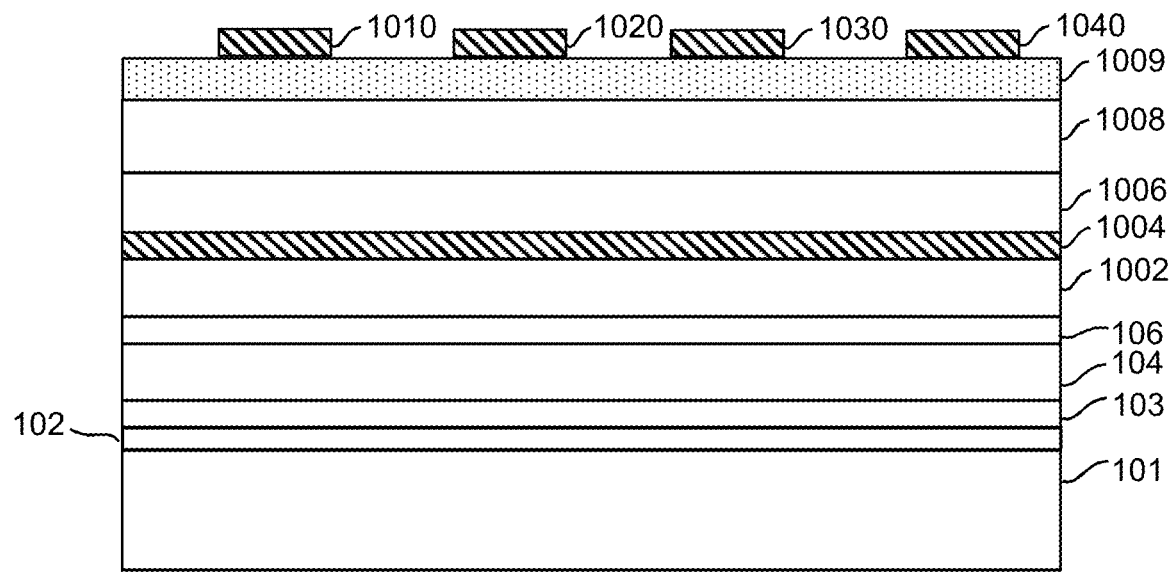
FIGS. 5a-5b illustrate intermediate structures during fabrication of a spin-transfer torque device.

With reference to FIG. 5a, a spin-transfer torque device, such as the device 100, may be formed by forming a layer stack including a bottom electrode layer 102, a seed layer 103, a magnetic flux guide layer 104, a coupling layer 106, a free layer 1002, a tunnel barrier layer 1004, a reference layer 1006, a pinning layer 1008 and a top electrode layer 1009. The layers of the layer stack may be deposited in a manner which per se is known in the art, for instance by a respective sputtering or evaporation process. The fabrication process may further include one or more annealing steps for causing crystallization of the magnetic layers while applying a magnetic field to the structure for setting a desired magnetization. If individual bottom electrodes for the MTJ pillars 110, 120, 130, 140 are to be formed, the bottom electrode layer 102 may following deposition be patterned into a number of discrete bottom electrodes parts with positions corresponding to the intended positions of the MTJ pillars 110, 120, 130, 140 which are to be formed.

Figure 5B:
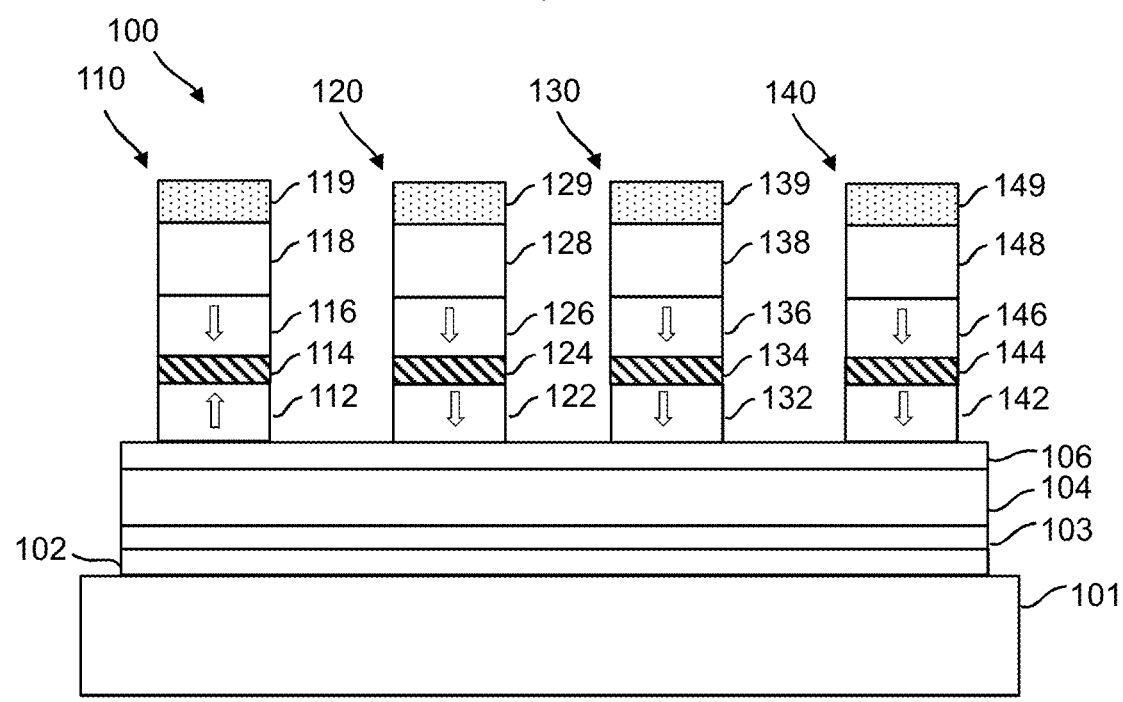
Figure 6:
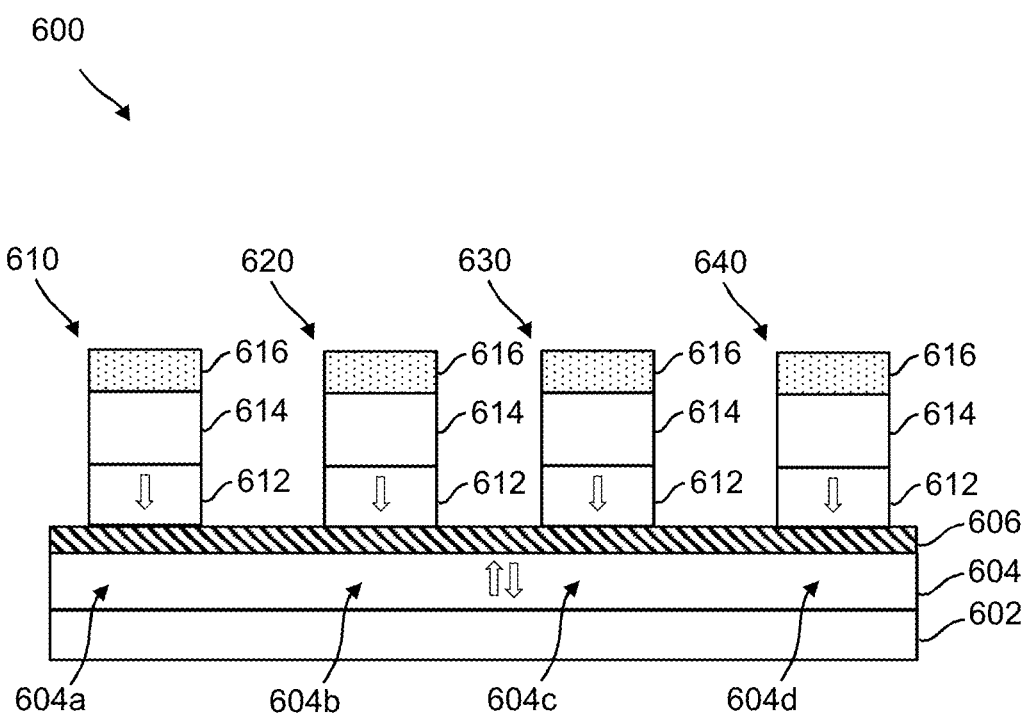
FIG. 6 illustrates a prior art spin-transfer torque device.

Subsequent to forming the layer stack, a plurality of separate MTJ pillars 110, 120, 130, 140, as shown in FIG. 5b, may be formed on the coupling layer 106 by etching the layer stack. An anisotropic dry etch process may be used, for instance an ion beam etch (IBE) or reactive ion etch (RIE) process.

A mask layer (not shown), for instance of a hard mask material such as TiN, Ta or TaN, may be deposited on the top electrode layer 1009 and patterned to form mask portions 1010, 1020, 1030, 1040 defining the positions and cross-sectional dimensions (for instance as oval or circular, or rectangular or more generally polygonal cross sections) of the MTJ pillars 110, 120, 130, 140 which are to be formed. The pattern defined by the mask portions may subsequently be transferred into the layer stack by etching to form the MTJ pillars 110-140, each pillar including a separate a free layer, a separate tunnel barrier layer, a separate reference layer, a separate pinning layer and a separate top electrode layer. During the etching of the layer stack, the coupling layer 106 may cover and thus counteract etching of the flux guide layer 104. The etching of the layer stack may accordingly be stopped on the coupling layer 106, i.e. when the coupling layer 106 is exposed. The mask portions 1010, 1020, 1030, 1040 may subsequently be removed.

After forming the MTJ pillars 110, 120, 130, 140, interlayer dielectrics embedding the MTJ pillars, and also conductive paths for connecting to the MTJs may be formed using conventional BEOL processing.

In the above the inventive concept has mainly been described with reference to a limited number of examples. However, as is readily appreciated by a person skilled in the art, other examples than the ones disclosed above are equally possible within the scope of the inventive concept, as defined by the appended claims.

In the above, a spin-transfer torque device configured as a majority gate device has been disclosed. It should, however, be noted that also other device configurations are possible. For instance, a device may include a single input MTJ pillar (such as MTJ pillar 130) and a single output MTJ pillar (such as MTJ pillar 140) arranged on a common flux guide layer and a common coupling layer. By the coupling between respective separate free layers of the input MTJ pillar and the output MTJ pillar, the state of the of the output pillar may be controlled by switching the state of the input pillar. More generally, a spin-logic device may include a set of MTJ pillars formed by at least one MTJ pillar configured as an input pillar and at least one MTJ pillar configured as an output pillar, wherein a magnetization state of the free layer of the output pillar is dependent on the magnetization states of the free layers of the input pillars.

What is claimed is:

1. A spin-transfer torque device, comprising:
a magnetic flux guide layer;
a set of magnetic tunnel junction (MTJ) pillars arranged above the magnetic flux guide layer, wherein each of the MTJ pillars includes a separate free layer, a separate tunnel barrier layer and a separate reference layer; and
a coupling layer arranged as a continuous layer extending in a horizontal direction and vertically arranged between the magnetic flux guide layer and the MTJ pillars,
wherein the coupling layer has a composition and thickness adapted to provide Ruderman-Kittel-Kasuya-Yosida interaction coupling between the separate free layer of the each of the MTJ pillars and the magnetic flux guide layer, such that a magnetization of the separate free layer of the each of the MTJ pillars is coupled, parallel or antiparallel, to a magnetization of the magnetic flux guide layer through the coupling layer.

2. The spin-transfer torque device according to claim 1, wherein the magnetic flux guide layer includes a ferromagnetic layer.

3. The spin-transfer torque device according to claim 1, wherein the magnetic flux guide layer is a ferromagnetic layer.

4. The spin-transfer torque device according to claim 2, wherein the ferromagnetic layer is formed of a material comprising CoFeB.

5. The spin-transfer torque device according to claim 2, wherein the coupling layer is a Ru layer.

6. The spin-transfer torque device according to claim 2, wherein the ferromagnetic layer is formed of a material comprising Co.

7. The spin-transfer torque device according to claim 1, wherein each of the separate tunnel barrier layers is formed of MgO and interposed between respective ones of the separate free layer and the separate reference layer.

8. The spin-transfer torque device according to claim 1, wherein the coupling layer is a non-magnetic layer adapted to provide a parallel or antiparallel coupling of the magnetization of the separate free layer of the each of the MTJ pillars to the magnetization of the magnetic flux guide layer.

9. The spin-transfer torque device according to claim 1, wherein the coupling layer comprises one or more of Ru, Ir, Rh or Os.

10. The spin-transfer torque device according to claim 9, wherein the coupling layer comprises Ru and has a thickness in the range of 13 Å±2 Å or 18 Å±2 Å, or wherein the coupling layer comprises Ir and has a thickness in the range of 14 Å±1 Å, 17 Å±2 Å, or 20 Å±2 Å, or wherein the coupling layer comprises Rh and has a thickness in the range of 15±1 Å or 18±2 Å.

11. The spin-transfer torque device according to claim 1, further comprising a bottom electrode layer or a set of separate bottom electrodes arranged under the flux guide layer.

12. The spin-transfer torque device according to claim 1, wherein a separate top electrode is arranged on the each of the MTJ pillars.

13. The spin-transfer torque device according to claim 1, wherein the set of MTJ pillars includes at least one MTJ pillar configured as an input pillar and at least one MTJ pillar configured as an output pillar, wherein a magnetization state of the separate free layer of the each of the at least one input pillar is configured to influence a magnetization state of the separate free layer of each of the at least one output pillar via the coupling layer and the magnetic flux guide layer.

14. The spin-transfer torque device according to claim 13, wherein the spin transfer torque device is configured as a majority gate device including three input pillars and one output pillar.

15. The spin-transfer torque device according to claim 1, wherein the magnetic flux guide layer and the coupling layer are coextensive in the horizontal direction.

16. A method of operating the spin-transfer torque device according to claim 13, the method comprising:
- applying a write current to a number of the input pillars to set a magnetization state of the separate free layer of each of the input pillars, thereby influencing a magnetization state of the separate free layer of the output pillar; and
- determining a magnetization state of the separate free layer of the output pillar.

* * * * *